(12) United States Patent
Jin et al.

(10) Patent No.: US 8,792,264 B2
(45) Date of Patent: *Jul. 29, 2014

(54) METHOD OF SWITCHING OUT-OF-PLANE MAGNETIC TUNNEL JUNCTION CELLS

(71) Applicant: Seagate Technology LLC, Cupertino, CA (US)

(72) Inventors: Insik Jin, San Jose, CA (US); Xiaobin Wang, Chanhassen, MN (US); Yong Lu, Edina, MN (US); Haiwen Xi, San Jose, CA (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/964,402

(22) Filed: Aug. 12, 2013

(65) Prior Publication Data
US 2013/0329490 A1 Dec. 12, 2013

Related U.S. Application Data

(63) Continuation of application No. 12/946,900, filed on Nov. 16, 2010, now Pat. No. 8,508,973.

(51) Int. Cl.
*G11C 11/22* (2006.01)
(52) U.S. Cl.
USPC .......................................... 365/145; 365/158
(58) Field of Classification Search
USPC ................................................. 365/145, 158
See application file for complete search history.

(56) References Cited

U.S. PATENT DOCUMENTS

| | | |
|---|---|---|
| 6,462,919 B1 | 10/2002 | Mack |
| 6,650,513 B2 | 11/2003 | Fullerton |
| 6,714,444 B2 | 3/2004 | Huai |
| 6,819,532 B2 | 11/2004 | Kamijo |
| 6,829,161 B2 | 12/2004 | Huai |
| 6,838,740 B2 | 1/2005 | Huai |
| 6,847,547 B2 | 1/2005 | Albert |
| 6,888,742 B1 | 5/2005 | Nguyen |
| 6,933,155 B2 | 8/2005 | Albert |
| 6,958,927 B1 | 10/2005 | Nguyen |
| 6,967,863 B2 | 11/2005 | Huai |
| 6,985,385 B2 | 1/2006 | Nguyen |
| 6,992,359 B2 | 1/2006 | Nguyen |
| 7,057,921 B2 | 6/2006 | Valet |
| 7,088,609 B2 | 8/2006 | Valet |
| 7,110,287 B2 | 9/2006 | Huai |
| 7,126,202 B2 | 10/2006 | Huai |
| 7,161,829 B2 | 1/2007 | Huai |
| 7,180,778 B2 | 2/2007 | Kawai et al. |
| 7,190,611 B2 | 3/2007 | Nguyen |
| 7,201,977 B2 | 4/2007 | Li |

(Continued)

OTHER PUBLICATIONS

Berger, Physic Rev. B 54, 9353 (1996).

(Continued)

*Primary Examiner* — Michael Tran
(74) *Attorney, Agent, or Firm* — Mueting Raasch & Gebhardt PA

(57) ABSTRACT

A method of switching the magnetization orientation of a ferromagnetic free layer of an out-of-plane magnetic tunnel junction cell, the method including: passing an AC switching current through the out-of-plane magnetic tunnel junction cell, wherein the AC switching current switches the magnetization orientation of the ferromagnetic free layer.

20 Claims, 3 Drawing Sheets

(56) References Cited

U.S. PATENT DOCUMENTS

| | | |
|---|---|---|
| 7,230,845 B1 | 6/2007 | Wang |
| 7,233,039 B2 | 6/2007 | Huai |
| 7,241,631 B2 | 7/2007 | Huai |
| 7,241,632 B2 | 7/2007 | Yang |
| 7,242,045 B2 | 7/2007 | Nguyen |
| 7,242,048 B2 | 7/2007 | Huai |
| 7,245,462 B2 | 7/2007 | Huai |
| 7,313,013 B2 | 12/2007 | Sun |
| 7,369,427 B2 | 5/2008 | Diao |
| 7,394,248 B1 | 7/2008 | Guo |
| 7,430,135 B2 | 9/2008 | Huai |
| 7,486,551 B1 | 2/2009 | Li |
| 7,486,552 B2 | 2/2009 | Apalkov |
| 7,489,541 B2 | 2/2009 | Pakala |
| 7,518,835 B2 | 4/2009 | Huai |
| 7,531,882 B2 | 5/2009 | Nguyen |
| 7,576,956 B2 | 8/2009 | Huai |
| 2005/0135020 A1 | 6/2005 | Sugita |
| 2005/0185455 A1 | 8/2005 | Huai |
| 2005/0201023 A1 | 9/2005 | Huai |
| 2006/0132990 A1 | 6/2006 | Morise |
| 2006/0187705 A1 | 8/2006 | Nakamura |
| 2006/0203503 A1 | 9/2006 | Casenave |
| 2007/0008661 A1 | 1/2007 | Min |
| 2007/0048485 A1 | 3/2007 | Jogo |
| 2007/0054450 A1 | 3/2007 | Hong |
| 2007/0063237 A1 | 3/2007 | Huai |
| 2007/0086121 A1 | 4/2007 | Nagase |
| 2007/0096229 A1 | 5/2007 | Voshikawa |
| 2007/0097734 A1 | 5/2007 | Min |
| 2007/0120210 A1 | 5/2007 | Yuan |
| 2007/0176251 A1 | 8/2007 | Oh |
| 2007/0188942 A1 | 8/2007 | Beach |
| 2007/0252186 A1 | 11/2007 | Yang |
| 2008/0062578 A1 | 3/2008 | Watanabe |
| 2008/0088980 A1 | 4/2008 | Kitagawa |
| 2008/0165453 A1 | 7/2008 | Kaiser |
| 2008/0230819 A1 | 9/2008 | Nguyen |
| 2008/0273380 A1 | 11/2008 | Diao |
| 2008/0310213 A1 | 12/2008 | Chen |
| 2008/0310219 A1 | 12/2008 | Chen |
| 2009/0050991 A1 | 2/2009 | Nagai |
| 2009/0079018 A1 | 3/2009 | Nagase |
| 2009/0237987 A1 | 9/2009 | Zhu |
| 2009/0302403 A1 | 12/2009 | Nguyen |
| 2010/0096716 A1 | 4/2010 | Ranjan |
| 2010/0271870 A1 | 10/2010 | Zheng |
| 2012/0139649 A1* | 6/2012 | Zhou et al. .......... 331/94.1 |

OTHER PUBLICATIONS

Diao et al., "Spin-transfer switching in MgO-based magnetic tunnel junctions" J. Appl. Phys. 99, 08G510 (2006).

Hosomi, H. Yamagishi, T. Yamamoto, K. Bessho, Y. Higo, K. Yamane, H. Yamada, M. Shoji, H. Hachino, C. Fukumoto, H. Nagao and H. Kano, "A Novel Nonvolatile Memory with Spin Torque Transfer Magnetization Switching: Spin-RAM," Electron Devices Meeting, IEDM Technical Digest, 2005, pp. 459-462, IEEE.

Jiang et al., "Temperature Dependence of Current-Induced Magnetization Switching in Spin Valves with a Ferromagnetic CoGd Free Layer" Phys. Rev. Lett. 97, 217202 (2006).

Li et al., "Effects of MgO tunnel barrier thickness on magnetohysteresis in perpendicularly magnetized magnetic tunnel junctions of GdFeCo/FeCo/MgO/FeCo/TbFe/Co" J. Appl. Phys. 99, 08T310 (2006).

Mangin, D. Ravelosona, J. A. Katine, J. J. Carey, B. D. Terris and E. E. Fullerton, "Current-induced magnetization reversal in nanopillars with perpendicular anisotropy," Nature Materials, 2006, pp. 210-215, vol. 5, Nature Publishing Group.

Meng et al., "Spin transfer in nanomagnetic devices with perpendicular anisotropy" J. Appl. Phys. 99, 08G519 (2006).

Miura, T. Kawahara, R. Takemura, J. Hayakawa, S. Ikeda, R. Sasaki, H. Takahashi, H. Matsuoka and H. Ohno, "A novel SPRAM (SPin-transfer torque RAM) with a synthetic ferrimagnetic free layer for higher immunity to read disturbance and reducing write-current dispersion," 2007 Symposium on VLSI, Technology Digest of Technical Papers, pp. 234-235.

Nakayama et al., "Spin transfer switching in TbCoFe/CoFeB/MgO/CoFeB/TbCoFe magnetic tunnel junctions with perpendicular magnetic anisotropy" J. Appl Phys. vol. 103, 07A710 ( 2008).

Nishimura et al., "Magnetic tunnel junction device with perpendicular magnetization films for high-density magnetic random access memory" J. Appl. Phys. 91, 5246 (2002).

Ohmori, H. et al., Perpendicular Magnetic Tunnel Junction with Tunneling Magnetoresistance Ratio of 64% Using MgO (100) Barrier Layer Prepared at Room Temperature, Journal of Applied Physics, 103, 07A911 (2008).

PCT Search Report and Written Opinion dated Jul. 21, 2010.

PCT Search Report and Written Opinion dated Jun. 14, 2010.

Sbbia, Rachid et al., Spin Transfer Switching Enhancement in Perpendicular Anisotropy Magnetic Tunnel Junctions with a Canted in-Plan Spin Polarizer, Journal of Applied Physics, American Institute of Physics, New York, U.S. LNKD-DOI:10.1063/1.3055373, vol. 105, No. 1., Jan. 6, 2009, pp. 13910, XP012119458.

Slonczewski, J.C. Current-driven excitation of magnetic multilayers. Journal of Magnetism and Magnetic Materials 159, L1-L7 (1996).

Sun, J.Z. Spin-current interaction with a monodomain magnetic body: A model study. Phys. Rev. B 62, 570 (2000).

U.S. Appl. No. 12/200,034 Xi et al., filed Aug. 28, 2009.

U.S. Appl. No. 12/233,764 Gao et al., filed Sep. 19, 2008.

U.S. Appl. No. 12/269,537 Tang et al., filed Nov. 12, 2008.

U.S. Appl. No. 12/248,237, filed Oct. 9, 2008, Inventor: Zhu.

U.S. Appl. No. 12/326,274, filed Dec. 2, 2008, Inventor: Dimitrov.

U.S. Appl. No. 12/398,214, filed Mar. 5, 2009, Inventor: Wang.

Xi et al., "Perpendicular magnetization and exchange bias in epitaxial Cu/Ni/Fe50Mn50 thin films" Phys. Rev. B 72, 024447 (2005).

Xi, Haiwen and Robert M. White, Antiferromagnetic Thickness Dependence of Exchange Biasing, Physical Review B, vol. 61, No. 1, Jan. 1, 2000-1.

* cited by examiner

METHOD OF SWITCHING OUT-OF-PLANE MAGNETIC TUNNEL JUNCTION CELLS This is a continuation application of U.S. patent application Ser. No. 13/964,402, filed Nov. 16, 2010, now U.S. Pat. No. 8,508,973, the disclosure of which is incorporated by reference herein in its entirety.

BACKGROUND

New types of memory have demonstrated significant potential to compete with commonly utilized forms of memory. For example, non-volatile spin-transfer torque random access memory (referred to herein as ST-RAM) has been discussed as a "universal" memory. Magnetic tunnel junction (MTJ) cells have has attracted much attention for their application in ST-RAM due to their high speed, relatively high density and low power consumption.

Most activities have been focused on MTJ cells with in-plane magnetic anisotropies. MTJ cells with out-of-plane magnetization orientations are predicted to be able to achieve lower switching currents than in-plane MTJ cells with the same magnetic anisotropy fields. Therefore, out-of-plane magnetization orientation MTJ cells and methods of utilizing them are an area of considerable interest.

BRIEF SUMMARY

The present disclosure relates to magnetic spin-torque memory cells, often referred to as magnetic tunnel junction cells, which have magnetic anisotropies (i.e., magnetization orientation) of the associated ferromagnetic layers aligned perpendicular to the wafer plane, or "out-of-plane", and methods of utilizing them.

One particular embodiment of this disclosure is a method of switching the magnetization orientation of a ferromagnetic free layer of an out-of-plane magnetic tunnel junction cell, the method including: passing an AC switching current through the out-of-plane magnetic tunnel junction cell, wherein the AC switching current switches the magnetization orientation of the ferromagnetic free layer.

Another particular embodiment of this disclosure is a magnetic memory system that includes a magnetic tunnel junction cell having a ferromagnetic free layer, a barrier layer, and a ferromagnetic reference layer, wherein the barrier layer is positioned between the ferromagnetic reference layer and the ferromagnetic free layer, and the magnetization orientation of the ferromagnetic free layer and the ferromagnetic reference layer are out-of-plane; and an AC current source electrically connected to the magnetic tunnel junction cell.

Yet another particular embodiment of this disclosure is a method of storing data electronically, the method including providing an out-of-plane magnetic tunnel junction memory cell, the out-of-plane magnetic tunnel junction memory cell including a ferromagnetic free layer, a barrier layer, and a ferromagnetic reference layer, wherein the barrier layer is positioned between the ferromagnetic reference layer and the ferromagnetic free layer, and the magnetization orientation of the ferromagnetic free layer and the ferromagnetic reference layer are out-of-plane; and passing an AC switching current through the out-of-plane magnetic tunnel junction cell, wherein the AC switching current switches the magnetization orientation of the ferromagnetic free layer, thereby storing a bit of data.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

The present disclosure is directed to various embodiments of magnetic tunnel junction (MTJ) cells having magnetic anisotropies that result in the magnetization orientation of the associated ferromagnetic layers to be aligned perpendicular to the wafer plane, or "out-of-plane".

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. Any definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

While the present disclosure is not so limited, an appreciation of various aspects of the disclosure will be gained through a discussion of the examples provided below.

Figure 1A:
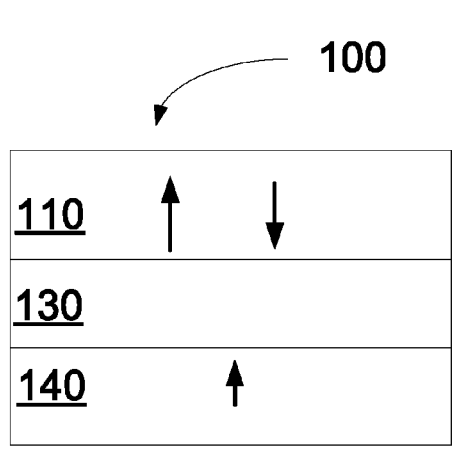
FIG. 1A is a schematic diagram of an illustrative MTJ cell.

FIG. 1A illustrates an exemplary MTJ cell 100 having out-of-plane magnetic orientation. MTJ cell 100 includes a relatively soft ferromagnetic free layer 110, a ferromagnetic reference (e.g., fixed) layer 140, and an oxide barrier layer 130. Ferromagnetic free layer 110 and ferromagnetic reference layer 140 are separated by the oxide barrier layer 130 or non-magnetic tunnel barrier. The MTJ cell 100 can also be described as having the oxide barrier layer positioned between the ferromagnetic reference layer and ferromagnetic free layer.

Free layer 110, and reference layer 140 each have an associated magnetization orientation. The magnetization orientations of layers 110 and 140 are oriented non-parallel to the layer extension and to the plane of the wafer substrate on which MTJ cell 100 is formed. In some embodiments, the magnetization orientations of layers 110 and 140 can be referred to as "out-of-plane". In embodiments, the magnetization orientations of layers 110 and 140 can be "at least substantially perpendicular". In embodiments, the magnetization orientations of layers 110 and 140 can be "perpendicular". The magnetization orientation of free layer 110 is more readily switchable than the magnetization orientation of reference layer 140. Other optional layers, such as seed layers, capping layers, or other layers can be included in the MTJ cell 100 even though they are not depicted in these figures.

Free layer 110 and reference layer 140 may independently be made of any useful ferromagnetic (FM) material such as, for example, Fe, Co or Ni and alloys thereof, such as NiFe and CoFe. Either or both of free layer 110 and reference layer 140 may be either a single layer or multilayers. Specific examples of materials that can make up the free layer and the fixed layer can include single layers with perpendicular anisotropy such as TbCoFe, GdCoFe, and FePt; laminated layers such as Co/Pt Co/Ni multilayers; and perpendicular anisotropy materials laminated with high spin polarization ferromagnetic materials such as Co/Fe and CoFeB alloys. In embodiments, the free layer 110 can include a high spin polarization layer such as Co and a rare earth-transition metal alloy layer such as GdFeCo. In embodiments, the reference layer 140 may include a high spin polarization layer such as Co and a rare earth-transition metal alloy layer such as TbFeCo.

Barrier layer 130 may be made of an electrically insulating material such as, for example an oxide material (e.g., $Al_2O_3$, $TiO_x$ or $MgO_x$) or a semiconductor material. Barrier layer 130 can be a single layer or can be a layer laminated with another oxide or metal (for example a Mg/MgO bilayer). Barrier layer 130 could optionally be patterned with free layer 110 or with reference layer 140, depending on process feasibility and device reliability.

Figure 1B:
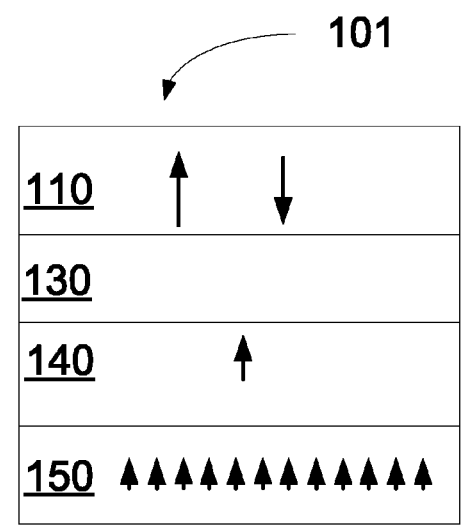
FIG. 1B is a schematic diagram of an illustrative MTJ cell that includes an optional pinning layer.

FIG. 1B illustrates another exemplary embodiment of a MTJ cell. This MTJ cell 101 includes an optional pinning layer 150 disposed proximate, or adjacent to the reference layer 140. The pinning layer 150, if present pins the magnetization orientation of reference layer 140. In some embodiments, such a pinning layer 150 may have a zero magnetization, but can still pin the magnetization orientation of the reference layer 140. A pinning layer, if present, may be an antiferromagnetically ordered material (AFM) such as PtMn, IrMn, and others.

Figure 1C:
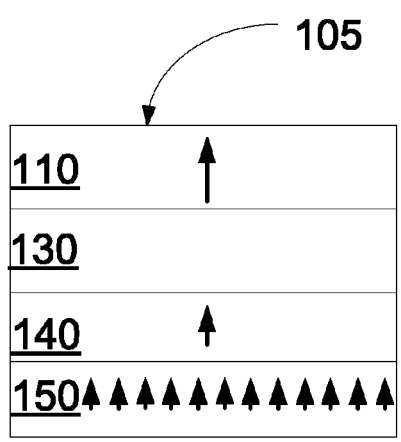
FIG. 1C is a schematic diagram of an illustrative MTJ cell with out-of-plane magnetization orientation in a low resistance state.
Figure 1D:
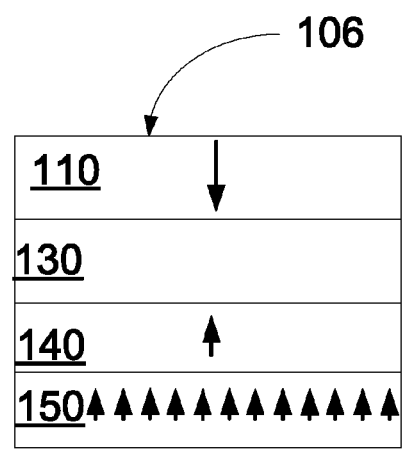
FIG. 1D is schematic side view diagram of the illustrative magnetic tunnel junction memory cell in a high resistance state.

FIG. 1C shows a magnetic tunnel junction memory cell 105 in a low resistance state where the magnetization orientation of free layer 110 is in the same direction as the magnetization orientation of reference layer 140. In FIG. 1D, the magnetic tunnel junction cell 106 is in the high resistance state where the magnetization orientation of the free layer 110 is in the opposite direction of the magnetization orientation of the reference layer 140. In some embodiments, the low resistance state may be the "0" data state and the high resistance state the "1" data state, whereas in other embodiments, the low resistance state may be "1" and the high resistance state "0".

Switching the resistance state and hence the data state of a magnetic tunnel junction cell via spin-transfer occurs when a switching current, passing through a magnetic layer of magnetic tunnel junction cell becomes spin polarized and imparts a spin torque on the free layer 110. When a sufficient spin torque is applied to the free layer 110, the magnetization orientation of the free layer 110 can be switched between two opposite directions and accordingly the magnetic tunnel junction cell can be switched between the low resistance state and the high resistance state.

Disclosed herein are methods of switching the magnetization orientation of a ferromagnetic free layer of an out-of-plane magnetic tunnel junction cell that includes the step of passing an alternating current switching current through the MTJ cell. Alternating current, which can also be referred to herein as "AC" is an electrical current in which the movement of electric charge (or electrons) periodically reverses direction. Application of an AC switching current through the MTJ cell switches (via spin torque as discussed above) the magnetization orientation of the free layer. In disclosed embodiments, gyromagnetic relaxation also assists in switching the magnetization orientation of the free layer. This can afford the use of a lower switching current, thereby allowing the consumption of less power, to be utilized to write data to an MTJ cell.

Gyromagnetic relaxation of a magnetic field can be described by equation 1:

$$\tilde{\tau}_g = (\tilde{M} \times \tilde{H}) \qquad \text{(Equation 1)}$$

where $\tilde{M}$ is the magnetization saturation of the free layer and $\tilde{H}$ is the magnetic field generated by a current. Conversely, damping relaxation can be described by equation 2:

$$\tilde{\tau}_d = \alpha \tilde{M} \times (\tilde{M} \times \tilde{H}) \qquad \text{(Equation 2)}$$

where $\tilde{M}$ and $\tilde{H}$ are as given above and $\alpha$ is about 0.01. Because of the magnitude of $\alpha$, the gyromagnetic relaxation is at least about 100 times higher than the damping relaxation in any given system. Therefore, if gyromagnetic relaxation can be utilized to assist in switching the magnetization orientation of the ferromagnetic free layer, the overall switching current can be reduced.

Figure 2A:
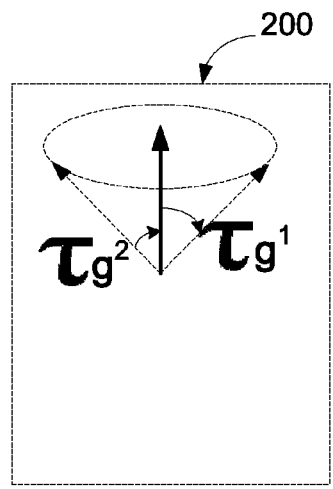
FIG. 2A is a schematic diagram illustrating the effect of a direct current (DC) switching current on the gyromagnetic relaxation of a magnetization orientation.
Figure 2B:
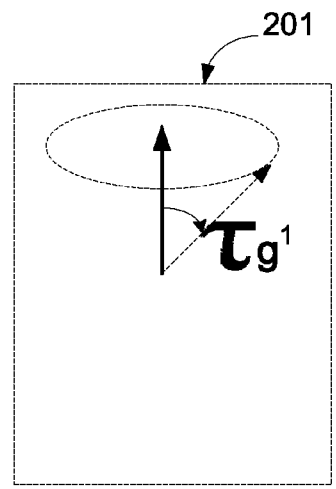
FIG. 2B is a schematic diagram illustrating the effect of an alternating current (AC) switching current on the gyromagnetic relaxation of a magnetization orientation.

The effect of a DC current on gyromagnetic relaxation is schematically depicted in FIG. 2A. As seen in FIG. 2A, a DC switching current pulls the magnetization orientation of the free layer (depicted by the solid arrow) equally away from the center in all directions, thereby effectively cancelling out the effect of the gyromagnetic relaxation. Conversely, the effect of an AC switching current is depicted in FIG. 2B. As seen in FIG. 2B, the gyromagnetic relaxation in this case does not cancel itself out and therefore assists in switching the magnetization orientation of the free layer. In embodiments that utilized an AC switching current, the AC switching current can induce a magnetic field that circumnavigates the magnetic tunnel junction cell, as seen in FIG. 2B. The induced magnetic field can induce gyromagnetic relaxation in the magnetization orientation of the ferromagnetic free layer. Such gyromagnetic relaxation can contribute to the switching of the ferromagnetic free layer. Because of the contribution of the gyromagnetic relaxation to the switching, a lower switching current can be used, which can afford memory that can function with lower power requirements.

In embodiments, the frequency of the AC switching current can be matched to the gyromagnetic frequency of the ferromagnetic free layer. The gyromagnetic frequency of the free layer is a function of magnetic properties of the free layer and the geometry of the free layer. The gyromagnetic frequency is generally in the GHz frequency range.

The AC switching current can be passed from the free layer through the barrier layer to the reference layer; or from the reference layer through the barrier layer to the free layer.

Disclosed methods can optionally further include reading or sensing the resistance state or data of the MTJ cell. The resistance state of a MTJ cell can be determined by passing a reading current through the MTJ cell. In embodiments, the reading current can be a DC reading current. The measured or sensed resistance (or voltage) can be compared to a reference resistance (or voltage). In embodiments, the reading current can have an amplitude that is less than the amplitude of the switching current. In embodiments, a DC reading current that has an amplitude that is less than the amplitude of the AC switching current can be utilized for reading or sensing the resistance of the MTJ cell.

Also disclosed herein are methods of storing data electronically that include providing a disclosed MTJ cell. Providing can include manufacturing, purchasing, configuring a MTJ cell within a system for storing data electronically, or other actions. The method can also include passing an AC switching current through the MTJ cell as described above to switch the magnetization orientation of the ferromagnetic free layer. Switching the magnetization orientation of the ferromagnetic free layer can function to store a bit of data, either a 0 (if the free layer is parallel to the reference layer for example) or a 1 (if the free layer is opposite to the reference layer for example). The direction that the AC switching current is passed through the MTJ will dictate whether a 0 or a 1 is stored in the MTJ.

Such a method can also include passing a reading current through the MTJ cell to measure or sense the resistance of the MTJ cell. A second (and subsequent) AC switching current (either in the same or a different direction) can also be passed through the MTJ cell either before, after, or both a reading current can be passed through the MTJ cell.

Figure 3:
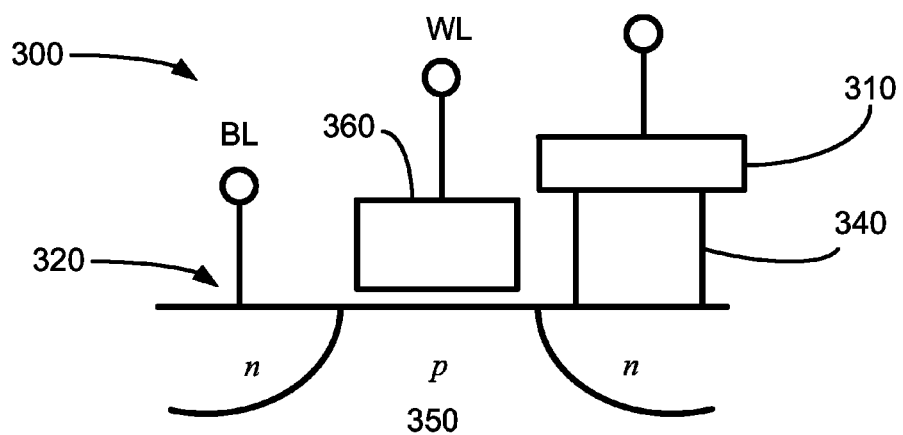
FIG. 3 is a schematic diagram of an illustrative memory unit including a MTJ cell and a transistor.

FIG. 3 is a schematic diagram of an illustrative memory unit 300 including a MTJ cell 310 electrically connected to a transistor 320, such as a semiconductor based transistor, via an electrically conducting element 340. MTJ cell 310 may be any of the MTJ cells described herein. Transistor 320 can include a semiconductor substrate 350 having doped regions (e.g., illustrated as n-doped regions) and a channel region (e.g., illustrated as a p-doped channel region) between the doped regions. Transistor 320 can include a gate 360 that is electrically coupled to a word line WL to allow selection and current to flow from a bit line BL to MTJ cell 310.

Figure 4:
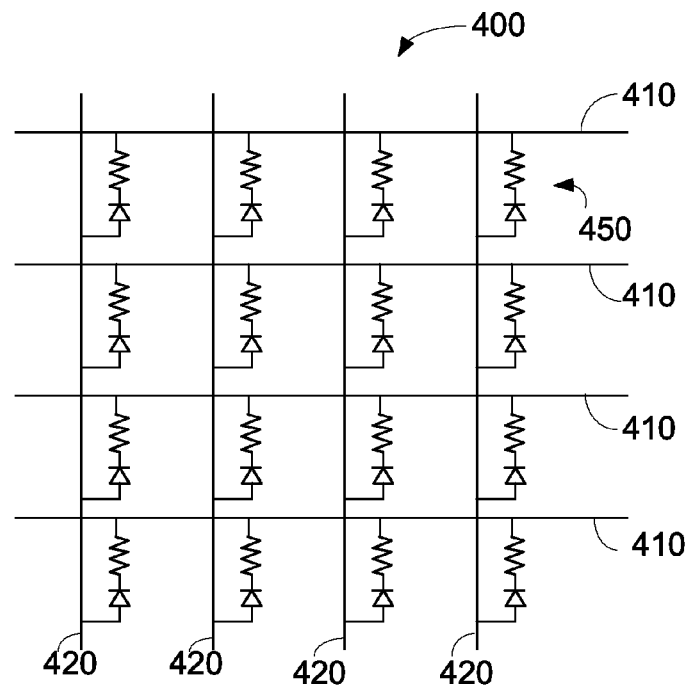
FIG. 4 is a schematic diagram of an illustrative memory array.

An array of programmable metallization memory units can also be formed on a semiconductor substrate utilizing semiconductor fabrication techniques. FIG. 4 is a schematic circuit diagram of an illustrative memory array 400. A plurality of memory units 450, described herein can be arranged in an array to form the memory array 400. The memory array 400 can include a number of parallel conductive bit lines 410. The memory array 400 can also include a number of parallel conductive word lines 420 that are generally orthogonal to the bit lines 410. The word lines 420 and bit lines 410 can form a cross-point array where a memory unit 450 can be disposed at each cross-point. The memory unit 450 and memory array 400 can be formed using conventional semiconductor fabrication techniques.

Figure 5:
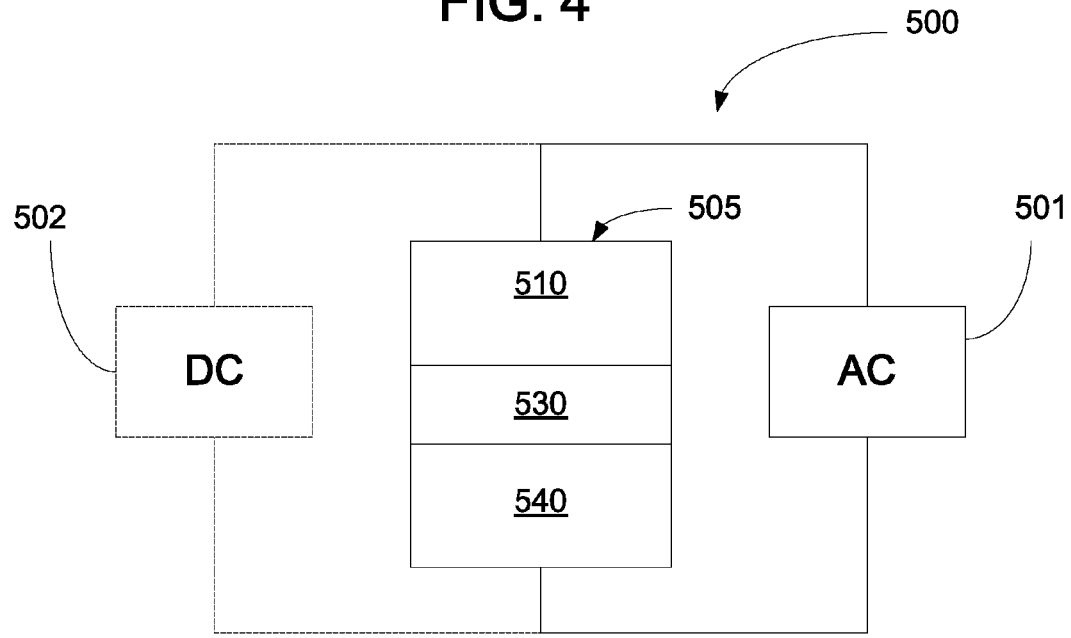
FIG. 5 is a schematic diagram of an illustrative memory system.

Also disclosed herein are memory systems. Disclosed memory systems can include a MTJ cell and an AC current source. An exemplary system is schematically depicted in FIG. 5. The magnetic memory system 500 can include a MTJ cell 505 that includes a free layer 510, a barrier layer 530 and a reference layer 540, as discussed above. The system 500 can also include an AC current source 501 that is electrically connected to the MTJ cell 505. Although not depicted herein, a transistor can also optionally be electrically connected to the MTJ cell 505. Such systems can also optionally include a plurality of MTJ cells configured in an array for example. In such an embodiment, each of the plurality of MTJ cells can be electrically connected to the AC current source. Such systems can also optionally include a DC current source 502 that is electrically connected to the MTJ cell 505 (or each of the plurality of MTJ cells). The DC current source can be utilized to read or sense the resistance of the MTJ cell (or the plurality of MTJ cells).

MTJ cells as disclosed herein can be manufactured using various techniques, including for example plasma vapor deposition (PVD), evaporation, and molecular beam epitaxy (MBE).

Methods of switching MTJ cells, methods of storing data, and memory systems as disclosed herein can be used in MRAM applications.

Thus, embodiments of METHODS OF SWITCHING OUT-OF-PLANE MAGNETIC TUNNEL JUNCTION CELLS are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present disclosure is limited only by the claims that follow.

What is claimed is:

1. A method of switching the magnetization orientation of an out-of-plane ferromagnetic free layer, the method comprising:
    passing an AC switching current through the out-of-plane ferromagnetic free layer, wherein the AC switching current switches the magnetization orientation of the ferromagnetic free layer.

2. The method according to claim 1, wherein the frequency of the AC switching current is matched to the gyromagnetic frequency of the ferromagnetic free layer.

3. The method according to claim 2, wherein the AC switching current induces a magnetic field that circumnavigates the magnetic tunnel junction cell.

4. The method according to claim 3, wherein the magnetic field induces gyromagnetic relaxation in the magnetization orientation of the ferromagnetic free layer.

5. The method according to claim 1, wherein the out-of-plane ferromagnetic free layer is part of a magnetic tunnel junction cell, the magnetic tunnel junction cell further comprising a barrier layer and an out-of-plane ferromagnetic reference layer with the barrier layer positioned between the out-of-plane ferromagnetic free layer and the ferromagnetic reference layer, and wherein the AC switching current is passed from the ferromagnetic reference layer to the out-of-plane ferromagnetic free layer.

6. The method according to claim 1, wherein the out-of-plane ferromagnetic free layer is part of a magnetic tunnel junction cell, the magnetic tunnel junction cell further comprising a barrier layer and an out-of-plane ferromagnetic reference layer with the barrier layer positioned between the out-of-plane ferromagnetic free layer and the ferromagnetic reference layer, and wherein the AC switching current is passed from the ferromagnetic free layer to the ferromagnetic reference layer.

7. The method according to claim 1 further comprising passing a DC reading current through the magnetic tunnel junction cell and sensing the resistance of the magnetic tunnel junction cell.

8. The method according to claim 7, wherein the DC reading current has an amplitude that is less than that of the AC switching current.

9. A magnetic memory system comprising:
- at least one magnetic tunnel junction cell having a ferromagnetic free layer, a barrier layer, and a ferromagnetic reference layer, wherein the barrier layer is positioned between the ferromagnetic reference layer and the ferromagnetic free layer, and the magnetization orientation of the ferromagnetic free layer and the ferromagnetic reference layer are out-of-plane;
- an AC current source electrically connected to the at least one magnetic tunnel junction cell; and
- a DC current source electrically connected to the at least one magnetic tunnel junction cell.

10. The magnetic memory system according to claim 9, wherein the magnetization orientation of the ferromagnetic free layer and the ferromagnetic reference layer are at least substantially perpendicular.

11. The magnetic memory system according to claim 9, wherein the magnetization orientation of the ferromagnetic free layer and the ferromagnetic reference layer are perpendicular.

12. The magnetic memory system according to claim 9 further comprising a plurality of magnetic tunnel junction cells configured in an array.

13. The magnetic memory system according to claim 9 wherein each of the plurality of magnetic tunnel junction cells are electrically connected to the DC and AC current sources.

14. The magnetic memory system according to claim 9, wherein the AC current source is configured to affect the orientation of the ferromagnetic free layer.

15. The magnetic memory system according to claim 9, wherein the DC current source is configured to sense the orientation of the ferromagnetic free layer.

16. A method of storing data electronically comprising:
- providing an out-of-plane magnetic tunnel junction memory cell, the out-of-plane magnetic tunnel junction memory cell comprising a ferromagnetic free layer, a barrier layer, and a ferromagnetic reference layer, wherein the barrier layer is positioned between the ferromagnetic reference layer and the ferromagnetic free layer, and the magnetization orientation of the ferromagnetic free layer and the ferromagnetic reference layer are at least substantially perpendicular; and
- passing an AC switching current through the out-of-plane magnetic tunnel junction cell, wherein the AC switching current switches the magnetization orientation of the ferromagnetic free layer, thereby storing a bit of data.

17. The method according to claim 16, wherein the AC switching current is matched to the gyromagnetic frequency of the ferromagnetic free layer, and the AC switching current induces a magnetic field that circumnavigates the magnetic tunnel junction cell.

18. The method according to claim 16, wherein the AC switching current is passed from the ferromagnetic reference layer to the ferromagnetic free layer or from the ferromagnetic free layer to the ferromagnetic reference layer.

19. The method according to claim 16 further comprising passing a DC reading current through the magnetic tunnel junction cell and sensing the resistance of the magnetic tunnel junction cell.

20. The method according to claim 16 further comprising:
- passing a DC reading current through the magnetic tunnel junction cell and sensing the resistance of the magnetic tunnel junction cell; and
- passing a second AC switching current through the magnetic tunnel junction cell to switch the magnetization orientation of the ferromagnetic free layer a second time.

* * * * *